United States Patent
Krug

(10) Patent No.: US 9,634,666 B2
(45) Date of Patent: Apr. 25, 2017

(54) PUSH-PULL DRIVER, A TRANSMITTER, A RECEIVER, A TRANSCEIVER, AN INTEGRATED CIRCUIT, A METHOD FOR GENERATING A SIGNAL AT AN OUTPUT

(71) Applicant: Intel IP Corporation, Santa Clara, CA (US)

(72) Inventor: Erwin Krug, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/861,629

(22) Filed: Sep. 22, 2015

(65) Prior Publication Data

US 2016/0182049 A1  Jun. 23, 2016

(30) Foreign Application Priority Data

Dec. 23, 2014  (DE) .................. 10 2014 119 479

(51) Int. Cl.
| | |
|---|---|
| *H03K 3/45* | (2006.01) |
| *H03K 19/0175* | (2006.01) |
| *H03K 19/00* | (2006.01) |
| *H03F 1/02* | (2006.01) |
| *H03F 3/24* | (2006.01) |
| *H03F 3/30* | (2006.01) |
| *H03F 3/45* | (2006.01) |

(52) U.S. Cl.
CPC ... *H03K 19/017545* (2013.01); *H03F 1/0222* (2013.01); *H03F 3/245* (2013.01); *H03F 3/303* (2013.01); *H03F 3/45475* (2013.01); *H03K 19/0013* (2013.01); *H03F 2200/102* (2013.01); *H03F 2203/45138* (2013.01)

(58) Field of Classification Search
USPC ..... 327/108–112; 326/82–84, 86, 88, 89, 92
See application file for complete search history.

(56) References Cited

U.S. PATENT DOCUMENTS

| 6,169,421 B1* | 1/2001 | Bryan ............... H03K 19/0013 326/83 |
| 6,570,405 B1* | 5/2003 | Lien ................ H03K 17/04123 326/83 |
| 7,876,129 B2* | 1/2011 | Lu .................... H03K 19/00361 326/68 |
| 7,973,564 B1* | 7/2011 | Chuang ........... H03K 17/04123 326/86 |
| 2012/0286578 A1 | 11/2012 | Uno et al. |
| 2014/0062590 A1 | 3/2014 | Khlat et al. |

* cited by examiner

*Primary Examiner* — An Luu
(74) *Attorney, Agent, or Firm* — Eschweiler & Potashnik, LLC

(57) ABSTRACT

A push-pull driver according to an example includes a push stage coupled via a first coupling capacitor to an output of the push-pull driver and a pull stage coupled via a second coupling capacitor to the output of the push-pull driver. Using an example may allow to improve a trade-off between saving energy, an overall complexity of a corresponding implementation, a robust and reliable operation and other parameters and design goals.

23 Claims, 9 Drawing Sheets

PUSH-PULL DRIVER, A TRANSMITTER, A RECEIVER, A TRANSCEIVER, AN INTEGRATED CIRCUIT, A METHOD FOR GENERATING A SIGNAL AT AN OUTPUT

REFERENCE TO RELATED APPLICATION

This Application claims priority to German Application number 10 2014 119 479.9 filed on Dec. 23, 2014, the contents of which are incorporated by reference in their entirety.

FIELD

The present disclosure relates to a push-pull driver, a transmitter, a receiver, a transceiver, an integrated circuit, a method for generating a signal at an output and corresponding software-related implementations.

BACKGROUND

In many applications, driver circuits are used for different purposes, for instance, in the framework of an amplifier circuit, to control an amplifier circuit or to decouple an input from an output, in order, for instance, to allow an impedance matching to name just a few examples. One driver architecture is a push-pull driver architecture, which comprises a pair of active devices, circuits or the like, which alternately supply current to or absorb current from a connected load.

For instance, in many mobile transmitter, receiver or transceiver applications, a push-pull driver may be used, for instance, to control a power amplifier supply. In these systems, the challenge exists to merely supply the power amplifier with enough energy to allow the power amplifier to operate reliably without risking distortions caused, for instance, by a lack of energy supplied to the power amplifier on the one hand, and on the other hand, to save as much energy as possible to allow the corresponding systems to operate longer. In mobile communication applications using an envelope tracking system represents an approach to control the power amplifier supply.

Apart from saving energy also further design goals may have to be considered when designing such a system. Among these design goals may be, for instance, an overall complexity of such an implementation, its reliability in terms of distortions and operations, available space and other parameters. As a consequence, a challenge exists to improve a trade-off between the previously-mentioned design goals and parameters.

However, also in other fields of applications and fields of technology similar challenges may exist when designing and operating corresponding systems.

SUMMARY

Therefore, a demand exists to improve a trade-off between saving energy, an overall complexity of a corresponding implementation, a robust and reliable operation and other parameters and design goals.

This demand may be satisfied by a push-pull driver, a transmitter, a receiver, a transceiver, an integrated circuit, a method for generating a signal at an output or corresponding software-related implementations.

BRIEF DESCRIPTION OF THE DRAWINGS

Some examples of circuits, devices, apparatuses and/or methods will be described in the following by way of example only. In this context, reference will be made to the accompanying Figures.

DETAILED DESCRIPTION

Figure 1:
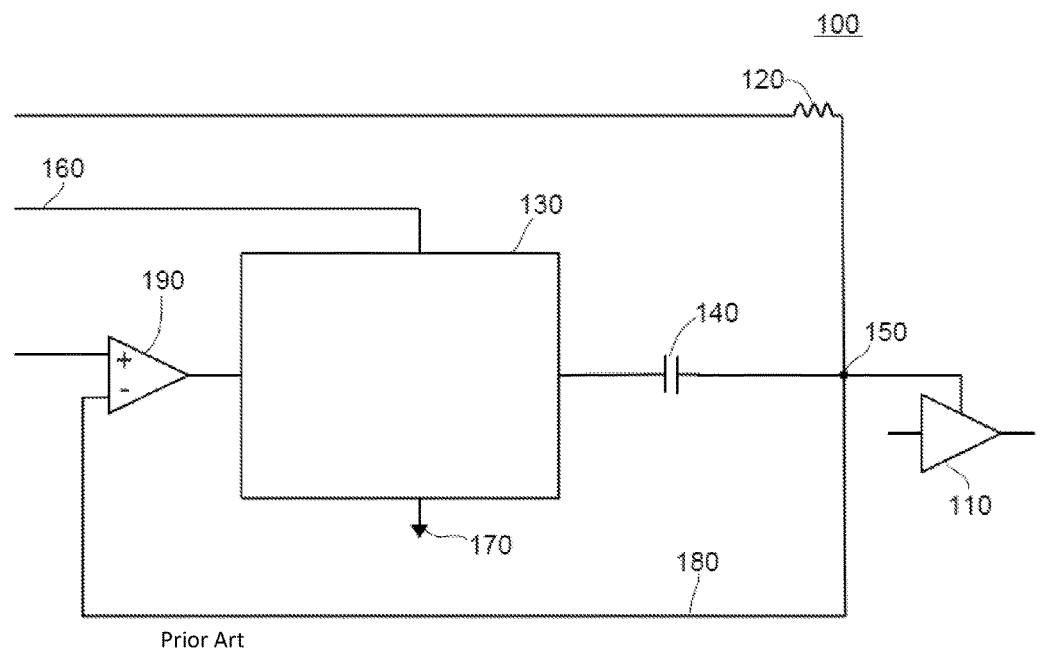
FIG. 1 shows a simplified block diagram of a conventional envelope tracking system based on a push-pull driver.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures. Moreover, summarizing reference signs will be used to refer to more than one structure, element or object or to describe more than one structure, element or object at the same time. Objects, structures and elements referred to by the same, a similar or a summarizing reference sign may be identically implemented. However, one, some or all properties, features and dimensions may also vary from element to element.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In many fields of applications and in many fields of technology, drivers are used for different purposes, for instance, in the framework of amplifiers or decoupling circuits to amplify an input signal to obtain an amplified version of that input signal as an output signal or to decouple different parts of a circuit, for instance, for impedance matching, respectively, to name just two examples. However, also in other areas driver circuits may be used for different purposes.

A driver architecture which may operate more efficiently than other architectures is the push-pull driver architecture. In a push-pull driver a pair of active devices, circuits or the like may be used, for instance, to alternately supply current to or absorb current from a load coupled to the push-pull driver. An example comes, for instance, from the field of amplifiers, in which a push-pull amplifier may be more efficient than a single-ended amplifier.

In the following, examples coming from mobile devices will be focused on mainly, although examples are by far not limited to this application. Although in the following mobile communication devices, circuits and devices as well as architectures comprised in such devices will be used to outlined and explained in more detail, examples may also be used in other fields of technology as well as other applications. In other words, transmitter, receiver or transceiver-related applications merely represent examples of where a push-pull driver according to an example may be employed.

In mobile devices, such as mobile communication devices, saving energy is often one of the more important design goals since it may allow the corresponding device to be operated for a longer period of time. In many of these devices power amplifiers or similar circuits are used, for instance, to amplify an input signal before pre-processing, processing or transmitting the amplified signal.

One of the challenges encountered by corresponding system designers may be variations in the amplitude of the signal to be amplified, which may lead to a waste of energy in the case in which the supplied power is too large, or to distortions, when the supplied energy is not sufficient to allow an undisturbed amplification of the signal by the power amplifier. In these systems, a push-pull driver may be used in an envelope tracking systems that provides a suitable driver supply having an energy high enough to allow a peak-to-peak signal generation, while on the other hand, in phases with lower amplitudes, also the magnitude of the supply signal may be reduced.

FIG. 1 shows a schematic block diagram of a part of an envelope tracking system 100, which may be part of a mobile communication device. The envelope tracking system 100 comprises a supply contact of the power amplifier 110 to which the energy needed to operate the power amplifier 110 can be supplied.

The power amplifier supply is divided into two components, a DC (direct current) or quasi-DC supply, which is coupled into the supply contact of the power amplifier by a decoupling inductor 120 and an AC (alternating current) supply signal component. The inductor 120 decouples the DC supply signal from the AC component or signal in terms of the frequency. The DC supply may, for instance, be also referred to as DC current. Via the DC supply a constant, a quasi-constant or a slowly changing supply signal may be provided to the power amplifier 110. However, a signal provided via the DC supply may also comprise higher frequency components.

The corresponding AC component of the supply signal may be provided by a push-pull driver 130, which is coupled to the supply contact of the power amplifier 110 via a coupling capacitor 140. The coupling capacitor 140, the inductor 120 and the supply contact of the power amplifier 110 are coupled to a supply node 150.

The inductor 120 may in terms of its inductance and the capacitor 140 in terms of its capacitance value be chosen by the system designer in such a way that the frequencies of the DC supply signal and the AC supply signal or component may be fed into the supply node 150 and limit the other signal interfering with the operation of the respective supply. In other words, the inductor 120 may be chosen in terms of its inductance in such a way that the AC supply component passing the coupling capacitor 140 is at least to some extend decoupled from a circuit providing the DC supply signal without hampering the DC supply signal from reaching the supply node 150. Accordingly, the capacitance value of the capacitor 140 may be chosen by the system designer in such a way that the DC supply signal or component does not interfere with the operation of the push-pull driver 130, but allows the AC supply signal or component reaching the supply node 150.

The push-pull driver 130 is coupled to a supply contact 160, which may, for instance, provide an appropriate supply voltage and/or supply current through the push-pull driver 130 to allow its operation. The push-pull driver 130 is further coupled to a contact for a reference potential 170. The reference potential may be, for instance, lower than the corresponding supply potential present at the supply contact 160.

Via a feedback 180, the supply node 150 is furthermore coupled to an inverting input of an operational amplifier 190. To a non-inverting input of the operational amplifier 190, an envelope tracking signal or ET signal may be provided. An output of the operational amplifier is coupled to the push-pull driver 130 on the basis of which an AC component of the power supply signal is provided to the supply node 150.

In the envelope tracking system 100 depicted in FIG. 1, the AC peaks of the supply signal for the power amplifier 110 are therefore provided by the push-pull driver 130, which may be implemented as a wideband driver. Due to the DC signal coupled via the inductor 120, the supply signal for the power amplifier 110 may be optionally DC-shifted. The DC supply signal and the AC supply signal may be decoupled from one another by the inductor 120 and the coupling capacitor 140.

The supply voltage or supply potential provided to the push-pull driver 130 may be high enough to allow a peak-to-peak voltage generation, which may eventually require a boost converter to be implemented. Such a boost converter may, however, negatively influence an overall efficiency of such a system in terms of its energy consumption due to its lower efficiency at high levels and low supply voltage levels or low battery voltages. Moreover, implementing a corresponding boost converter may additionally require design efforts.

Figure 2:
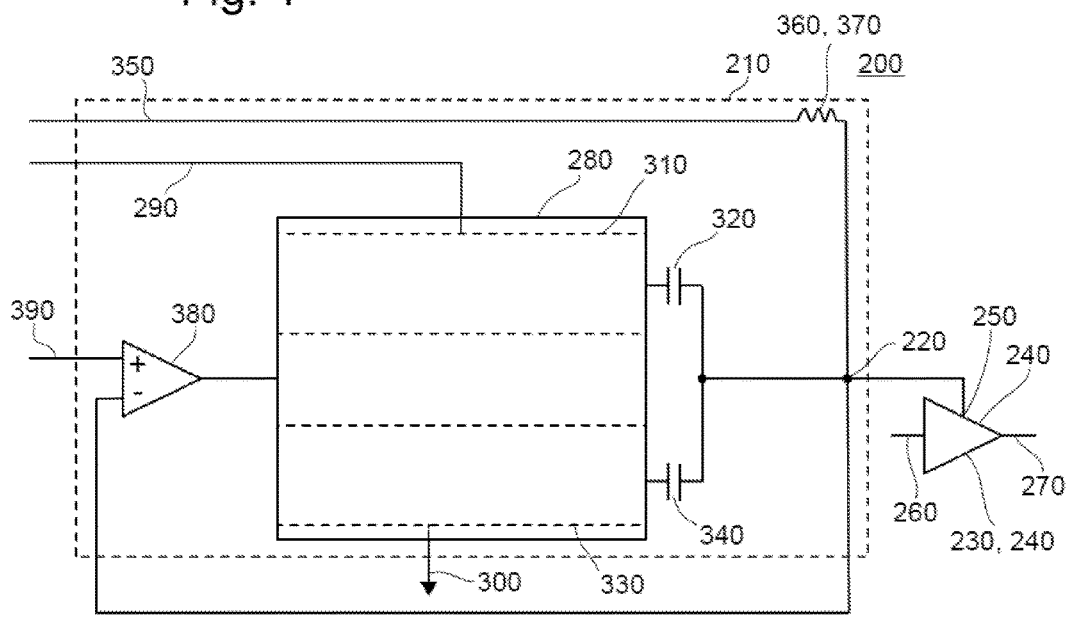
FIG. 2 shows a simplified block diagram of a push-pull driver according to an example in an envelope tracking system.

FIG. 2 shows a simplified block diagram of an envelope tracking system 200 comprising a push-pull driver 210 according to an example, an output 220 of which is coupled to a load 230, which is once again depicted in FIG. 2 as a power amplifier 240. The power amplifier 240 may, for instance, correspond to the power amplifier 110 as depicted in FIG. 1.

To be a little more specific, the output 220 is coupled to a supply contact 250 of the power amplifier 240, which is configured to provide the power amplifier 240 with the necessary energy to operate. Via an input 260, the power amplifier 240 is provided with an input signal to be amplified, which is then provided in an amplified form as the output signal of the power amplifier 240 at its output 270.

However, instead of the power amplifier 240, the push-pull driver 210 may equally well be coupled to another load, such as a resistive load or the like.

The push-pull driver 210 comprises a driver circuit 280, which is coupled to a contact for a supply potential 290 and a contact 300 for a reference potential. The reference potential may, for instance, be smaller than the supply potential. For instance, the reference potential may coincide with a ground potential, but may also be different from the ground potential. For instance, in the case of a symmetric driver circuit 280 and, hence, a symmetric push-pull driver 210, the reference potential may, for instance, correspond to the negative supply potential. However, also any other reference potential may be used, for instance, any potential between ground and the supply potential.

The push-pull driver 210 comprises a push stage 310, which is coupled via a first coupling capacitor 320 to the output 220 of the push-pull driver 210. The push-pull driver 210 further comprises a pull stage 330, which is coupled via a second coupling capacitor 340 to the output 220 of the push-pull driver.

As a consequence, the driver supply provided at the contact for the supply potential 290 may eventually not be required to provide a sufficient voltage range to cover the full operation of the push-pull driver 210. The supply potential, which is also referred to as driver supply voltage with respect to the reference potential, may therefore only need to support peak voltage generation for approximately half of the total voltage swing. As a consequence, it may eventually be possible to reduce the driver supply voltage and, hence, the supply potential to be approximately half of the voltage of the more conventional solution depicted in FIG. 1.

It may be possible to operate a push-pull driver 210 according to an example without implementing a boost converter, which may reduce the efficiency of the overall implementation. For instance, it may be possible to provide the supply potential using a buck converter with a better efficiency compared to a boost converter. It might even be possible to directly obtain the necessary energy and the necessary supply potential from a battery voltage of a battery powering such a device.

However, instead of implementing a single capacitor 140, in the push-pull driver 210 according to an example at least two separate coupling capacitors 320, 340 are used to separately couple the push stage 310 and the pull stage 330 to the output 320 of the push-pull driver, respectively. However, while an additional decoupling capacitor may be needed, it may be possible to implement the circuitry having a simpler overall layout than, for instance, a boost DC/DC converter. Furthermore, in a conventional approach when a boost DC/DC converter is used, the power consumption of such an implementation may even be significantly increased or even doubled independent of the output voltages.

In contrast, using a push-pull driver 210, for instance, the circuitry depicted in more detail below, for low output voltages doubling the power may even be prevented, when, for instance, the envelope tracking system and its wideband driver needs to output peaks.

In the example depicted in FIG. 2, the push stage 310 is coupled between the contact 290 for the supply potential and the first coupling capacitor 320. Similarly, the pull stage 330 is coupled between the contact for the reference potential 300 and the second coupling capacitor 340. The first coupling capacitor 320 and the second coupling capacitor may be permanently coupled to the output 220 of the push-pull driver 210 during operation. The output 220 may be formed by a common contact coupled to both the first coupling capacitor 320 and the second coupling capacitor 340.

As described above in the context of FIG. 1, the push-pull driver 210 may further comprise an input 350 for an additional input signal which may, for instance, correspond to the previously-mentioned DC supply signal or DC supply component. The input 350 may be coupled to the output 220 via a decoupling element 360 which may, for instance, be implemented as a low-pass filter, an inductive element, an inductor 370 or any combination thereof. Along with the first and second coupling capacitors 320, 340, the additional input signal provided via the input 350 may be decoupled from the push stage 310 and the pull stage 330, but may yet reach the output 220, while the first and second coupling capacitors 320, 340 may allow an output signal provided by the push stage 310 and the pull stage 330 to reach the output 220. However the input 350 may be decoupled from the push stage 310 and the pull stage 330 by the decoupling element 360. Once again, by carefully designing the decoupling element 360 and the corresponding first and second coupling capacitors 320, 340, which are coupled in parallel to the output 220, the previously-described decoupling of the push stage 310 and the pull stage 330 from the input 350 may be implemented depending on the frequencies involved. The additional input signal provided to the input 350 may, for instance, be a constant signal, a quasi-constant signal or a signal with a frequency being lower than the frequencies of the signal provided by the push stage 310 and the pull stage 330. However, in the signal provided to the input 350 also frequencies with a higher frequency may be present.

The output 220 of the push-pull driver 210 is fed back to an operational amplifier 380. Here, the output 220 is coupled to an inverting input of the operational amplifier 380, while the non-inverting input of the operational amplifier 380 may be coupled to an input 390 for a target signal, which may, for instance, correspond to an envelope tracking signal or ET signal as described before. The operational amplifier 380 may, for instance, generate a different signal based on the signal obtained from the output 220 and the target signal and provide the different signal to the driver circuit 280 and which may be used to control the push stage 310 and the pull stage 330.

However, instead of the coupling the input 390 to the non-inverting input of the operational amplifier 380 and coupling the output 220 to the inverting input of the operational amplifier 380, the roles of the inverting and the non-inverting inputs of the operational amplifier 380 may equally well be exchanged in other examples. In this case, the signal provided by the operational amplifier 380 may be inverted. In such an implementation, the stages 310, 320 of the push-pull driver 210 or an element processing the signal from the operational amplifier 380 may reinvert the signal from the operational amplifier 380. In case the inputs of the operational amplifier 380 are switched compared to the implementation in this figure, an inverted signal is generated to control the subsequent block. For instance, the subsequent block may in itself contain circuitry that inverts the polarity of this control signal, for instance, by coupling it to an inverting amplifier or using directly transistors that include an inverting functionality in their functionality. This may be achieved by using transistors with an appropriate characteristic.

As the implementation depicted in FIG. 2 shows, the push output and the pull output are separated from one another using separate decoupling capacitors 320, 340 to decouple the output 220 from the DC shift provided to the push-pull driver 210 via its input 350. Depending on the implementation, only single peak voltages may have to be driven by each of the driver stages (push stage 310, pull stage 330). The other stage may have the other plurality such that its corresponding output is non-active and insulating only. As each separate output of the two stages 310, 330 only has to actively drive one polarity, the driver supply voltage may be reduced, for instance, to half the voltage of the voltage swing.

Figure 3:
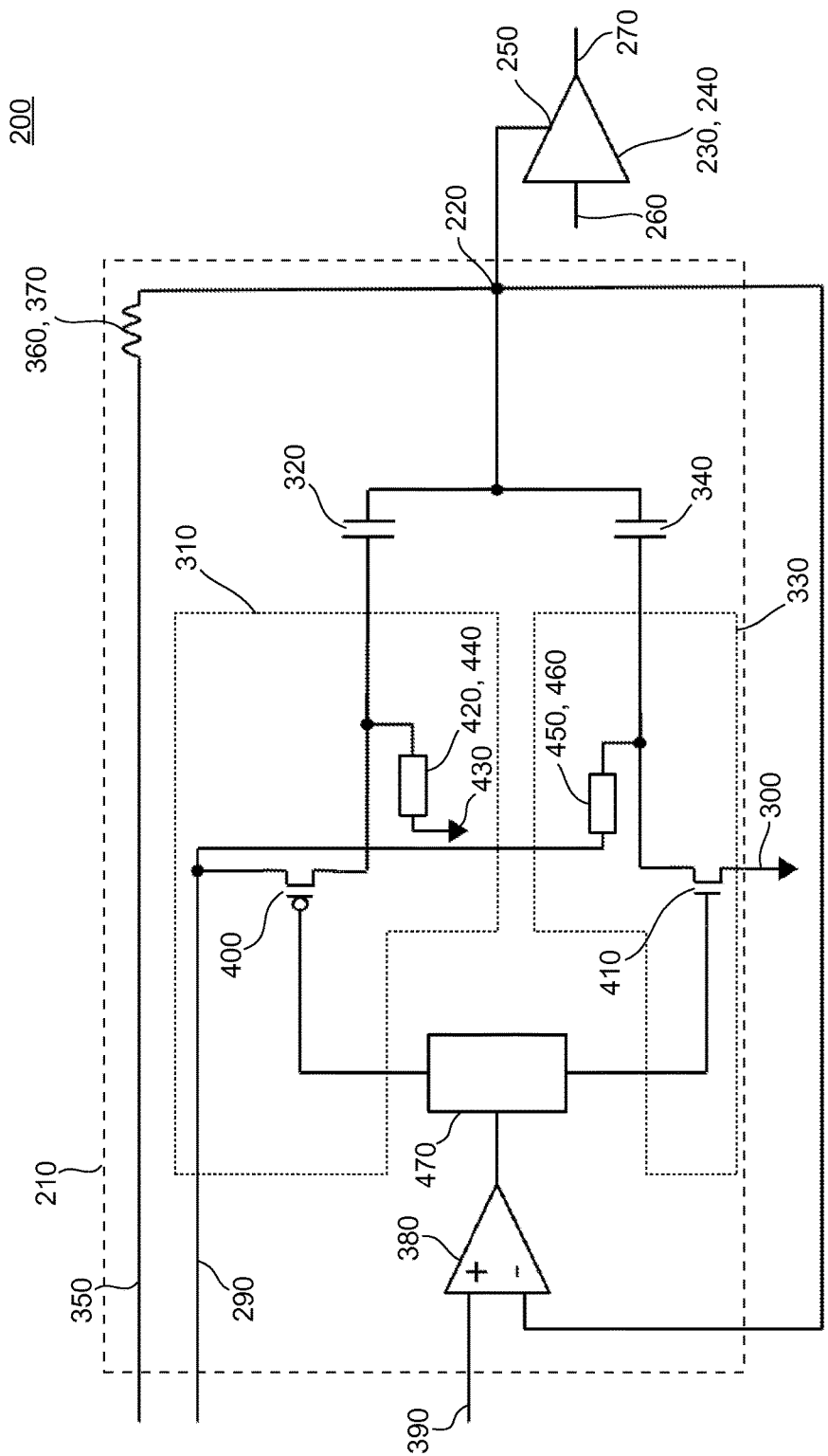
FIG. 3 shows a circuit diagram of a push-pull driver according to an example.

FIG. 3 shows a more detailed circuit diagram of an envelope tracking system 200 as shown in FIG. 2. The circuit diagram depicted in FIG. 3 resembles the block diagram of FIG. 2 with respect to many details with respect to which reference is hereby made to the previous description. For instance, the block diagram of FIG. 2 and the circuit diagram of FIG. 3 bear a very high degree of similarity for instance with respect to the load 230 in the form of the power amplifier 240, the operational amplifier 380 as well as the output 220 along with the first and second coupling capacitors 320, 340, to name just some examples.

However, FIG. 3 shows more details, for instance, with respect to the push stage 310 and the pull stage 330. The push stage 310 comprises a push transistor 400, which is coupled between the contact 290 for the supply potential of the first coupling capacitor 320. The pull stage 330 similarly comprises a pull transistor 410, which is coupled between the contact 300 for the reference potential and the second coupling capacitor 340. The push transistor 400 and the pull transistor 410 are, in the example depicted in FIG. 3, complementary transistors. While the push transistor 400 is implemented in FIG. 3 as a PMOS (p-channel metallic oxide semiconductor) transistor, the pull transistor 410 is implemented as NMOS (n-channel metallic oxide semiconductor) transistor. Hence, the push transistor 400 operates based on positive charge carriers such as holes in its channel, while the pull transistor 410 operates based on negative charge carriers such as electrons in its channel.

However, instead of the depicted PMOS and NMOS transistors, other field-effect transistors or other transistor types may be used.

The push stage 310 further comprises a pull-down resistive element 420, which is coupled between the first coupling capacitor 320 and a contact 430 for the reference potential. Although depicted as a resistor 440, the pull-up resistive element 420 may comprise a transistor, a diode or any combination of a resistor, a transistor and a diode to name just some examples. For instance, the pull-down resistive element 420 may be based on switch transistors, diodes, shunting transistors, resistors, diodes or other corresponding circuits.

Similarly, the pull stage 330 comprises a pull-up resistive element 450, which is coupled between the second coupling capacitor 340 and the contact 290 for the supply potential. Similar to the pull-down resistive element 420, the pull-up resistive element 450 is also depicted in FIG. 3 as a resistor 460, but may equally well be implemented based on a resistor, a transistor, a diode or any combination as outlined before.

The first coupling capacitor 320 is, apart from the coupling via the output 220, at least temporarily electrically decoupled from the pull-transistor 410. Similarly, the second coupling capacitor 340 is, apart from the similar coupling via the output 220, at least temporarily electrically decoupled from the push transistor 400. Hence, the respective capacitors 320, 340 may, apart from the possible coupling via the output 220, be insulated from the respective transistors 410, 400, respectively. In yet other words, the capacitors 320, 340 will not be able to alter the potential of the respective transistors 410, 400, respectively, when the capacitors 320, 340 are decoupled from the transistors 410, 400 respectively. In other words, an electrical coupling over a contact having under normal operational conditions a fixed potential such as the contact 290 for the supply potential or the contacts 300, 430 for the reference potential are not taken into account, since under normal operational conditions they may have a sufficiently low impedance such that the potentials present at these contacts may be considered to be fixed and, therefore, not changeable by variations of the potential or the voltage across the respective capacitors 320, 340. In other words, a coupling via any object, structure, contact or the like having a fixed potential during operation is not considered in this context.

In the example depicted in FIG. 3, the first coupling capacitor 320 is, apart from the coupling via the output 220, permanently electrically decoupled from the pull transistor 410 during operation. Similarly, the second coupling capacitor 340 is, apart from the previously-mentioned coupling via the output 220, permanently electrically decoupled from the push transistor 400 during operation.

The push-pull driver 210 as depicted in FIG. 3 further comprises a control circuit 470 coupled to both the push transistor 400 and the pull transistor 410. The control circuit 470 generates during operation a control signal for the push transistor 400 and a control signal for the pull transistor, which are then provided to the respective transistors 400, 410 also by the control circuit 470. The control signals for the push transistor 400 and for the pull transistor 410 are generated based on the different signal provided by the operational amplifier 380. Therefore, the control signals for the push transistor 400 and the pull transistor 410 are also based on the signal from the output 220 of the push-pull driver 210 and on the target signal provided to the input 390. Accordingly, the control signals generated by the control circuit 470 represent control signals for the push stage 310 and the pull stage 330, respectively. The control circuit 470 may, for instance, comprise diodes which generate, in response to the signal provided to the control circuit 470, the corresponding control signals for the push transistor 400 and the pull transistor 410.

Due to using for the push stage 310 and the pull stage 330 individual first and second coupling capacitors 320, 330, respectively, in the circuit shown in FIG. 3, the required discharge currents are realized by implementing the pull-down resistive element 420 and the pull-up resistive element 450 in this example. These resistive elements 420, 450 can maintain the appropriate voltage levels at the first and second coupling capacitors 320, 340 which are also referred to as level-shifting capacitors, despite the current being sourced or drained by the push transistor 400 and the pull transistor 410, respectively, during the active parts of the push-cycle or the pull-cycle. As will be described in the context of FIG. 4, these cycles correspond approximately to a positive pulse and a negative pulse, respectively. The resistive elements 420, 450, which are implemented in the example depicted in FIG. 3 as resistors 440, 460 consume some power both during active and free-wheeling phases. Instead of these resistors 440, 460 other more advanced and efficient circuitry may be used at the expense of a more complicated overall circuitry. For instance, these circuitries may comprise switch transistors, diodes, shunting transistors, resistors, diodes or other elements as described before. However, for the sake of simplicity, these alternatives are not depicted in FIG. 3.

The resistive recovery current generation may, however, result in a doubling of the input current. Along with approximately half the input voltage, the overall power consumption remains approximately the same compared to an implementation comprising a boost DC/DC converter. However, due to not implementing a DC/DC converter, it may still be possible to reduce an overall complexity of an implementation based on a push-pull driver 210 according to an example. For instance, tests have shown that compared to a conventional implementation based on a boost DC/DC converter, the current consumption rose from approximately 8.9 mA to approximately 18 mA. Taking the reduction of the supply voltage or supply potential as well as the efficiency of a boost DC/DC converter into account, it may be possible to reduce even under these conditions an overall energy consumption and to lower the complexity of such a circuit.

Figure 4:
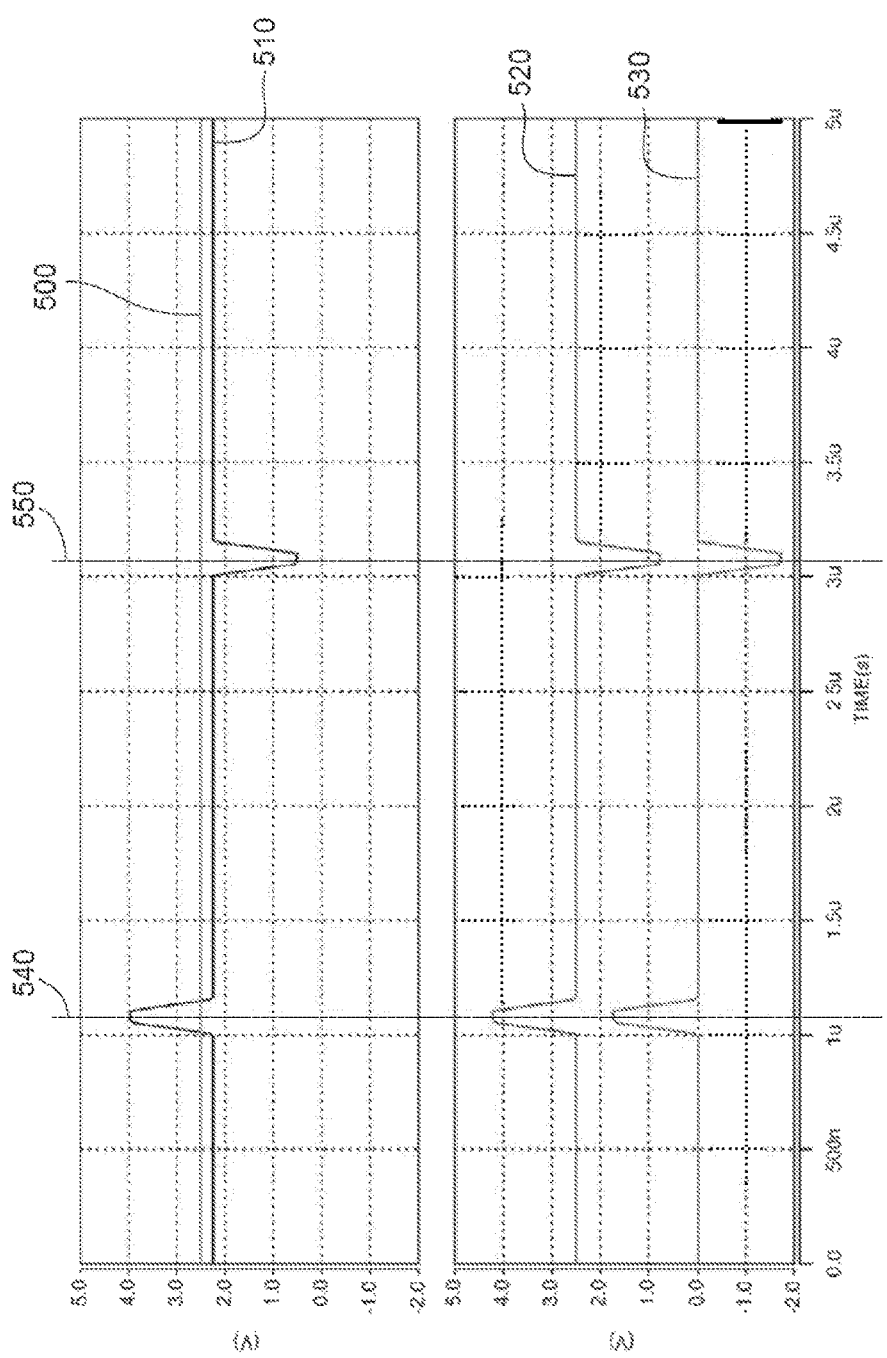
FIG. 4 illustrates an operation of a push-pull driver according to an example.

FIG. 4 shows a comparison of four plots 500, 510, 520 and 530 indicating a potential or a voltage with respect to the reference potential at different points in the circuit shown in FIG. 3 as a function of time. The first plot 500 corresponds to the supply potential provided to the contact 290. The second plot 510 corresponds to the voltage or potential present at the output 220 of the push-pull driver 210. The third plot 520 corresponds to the voltage or potential provided by the pull transistor 410 to the second coupling capacitor 340. Similarly, the fourth plot 530 corresponds to the voltage or potential provided by the push transistor 400 to the first coupling capacitor 320.

In this example, the driver supply voltage or, in other words, the supply potential provided to the contact 290 corresponds to a constant potential of 2.5 V, which represents the active driver range. As a consequence, the first plot 500 is constant as a function of time.

The output of the push stage 310, which corresponds to the fourth plot 530 for positive peaks, operates from close to 0 V to approximately 1.8 V. Similarly, the output of the pull stage 330 for negative peaks operates from close to 2.5 V to approximately 0.8 V.

To illustrate the operation of the push-pull driver 210 in a little bit more detail, the control circuit 470 controls the push transistor 400 and the pull transistor 410 in such a way that at the times indicated approximately by a first line 540 and a second line 550 the output 220 produces two peaks as indicated by the second plot 510. Correspondingly, the potentials of the pull stage 330 and of the push stage 310 as indicated by the third plot 520 and the fourth plot 530, respectively, show corresponding structures.

In terms of the push stage 310, an inactive period, which corresponds to the period of time indicated by the second line 550 and shown in the fourth plot 530, the output of the push stage 310 is inactive and the voltage is determined primarily by the output of the pull stage 330 via the previously-mentioned coupling of the first and second coupling capacitors 320, 340. The push stage 310 is, in other words, inactive during this time except for a small period of time corresponding to a back side of the pulse. This negative peak or dip of the fourth plot 530 at the time corresponding to the second line 550 is, therefore, also referred to as "free-wheeling negative peak". The pull stage 330, on the other hand, actively drives the output 220 into this stage. As a consequence, the negative peak or dip of the third plot 520 is, therefore, also referred to as "active negative peak", since the pull stage 330 actively causes the drop of the potential of the output 220 as depicted in the second plot 510 at the time corresponding to the second line 550.

Similarly, the inactive period of the pull stage is also referred to as a "free-wheeling positive peak" and corresponds to the potential of the output of the pull stage 330 as indicated in the third plot 520 at the period of time corresponding to the first line 540. Here, the pull stage 330 is inactive such that the voltage or potential is primarily determined by the output of the push stage 310 except for the back side of the pulse. As a consequence, the peak of the push stage 310 as indicated in the fourth plot 530 at the period of time corresponding to the first line 540 is also referred to as "active positive peak".

The resulting output signal at the output 220 of the push-pull driver 210, which may be, for instance, the envelope tracking signal provided to the power amplifier 240, has in the example depicted in FIG. 4, a peak-to-peak voltage of approximately 3.5 V. Half of that swing is generated by the push stage 310 and half by the pull stage 330, which both operate in voltage ranges of approximately 0-2.5 V. Their outputs are shifted to the desired voltage range by the corresponding capacitors, namely the first coupling capacitor 320 and the second coupling capacitor 340.

In FIGS. 2, 3 and 4 an envelope tracking driver with a DC shift for positive and negative pulses has been described, which may, for instance, be used in the framework of an envelope tracker for a power amplifier. In these examples, a resistive recovery current generation has been used as previously described. In the following, an active approach will be described comprising an active recovery current generation.

Figure 5:
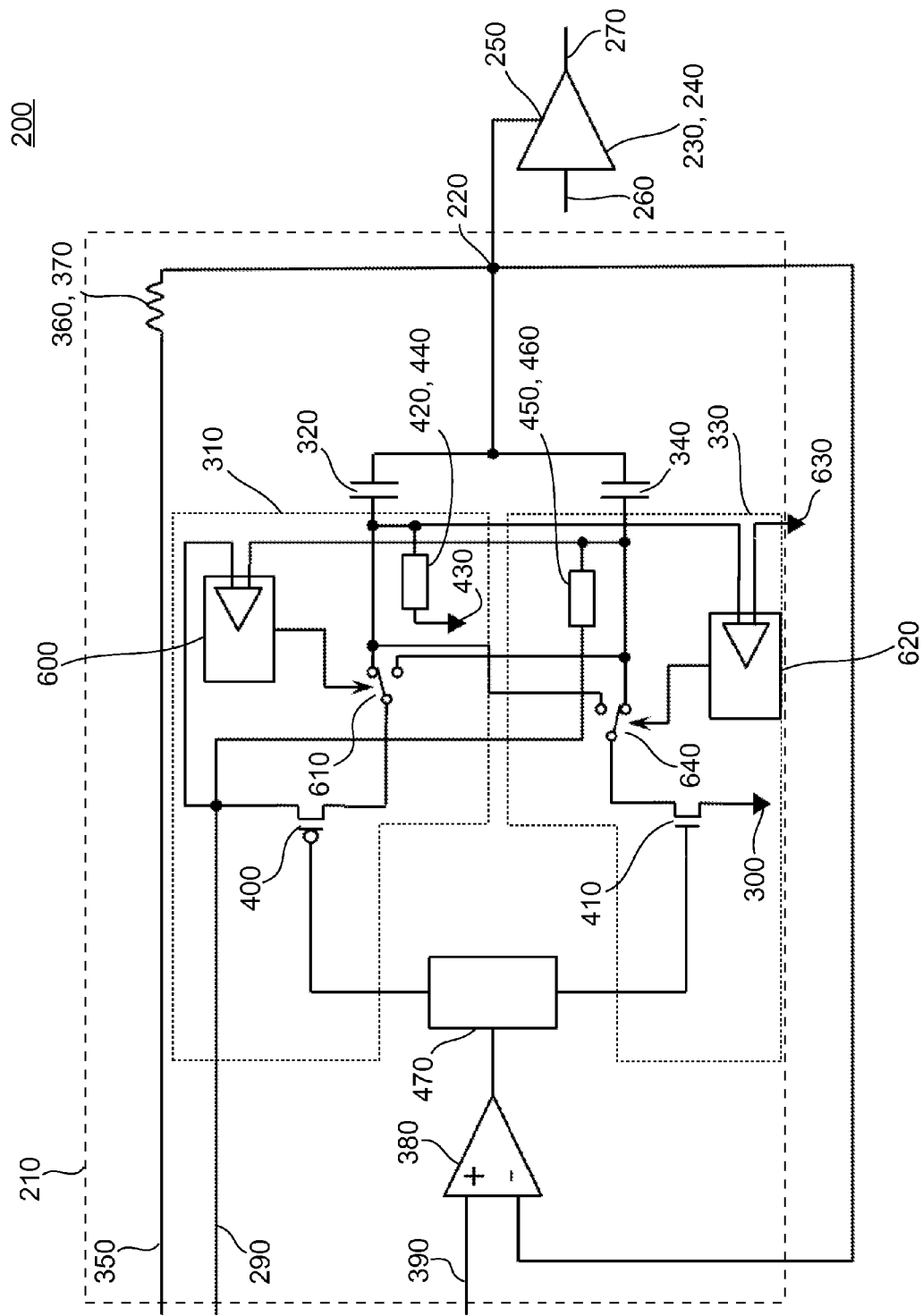
FIG. 5 shows a circuit diagram of a push-pull driver according to a further example.

In these examples, the push-pull driver 210 comprises a plurality of transistors, which comprise the push transistor 400 and the pull transistor 410. As will be described in more detail below, the push-pull driver comprises a pull-up control circuit and a pull-down control circuit, which are coupled to another transistor than the push transistor 400 or the pull transistor 410, respectively. In the example of FIG. 5, the plurality of transistors comprises exactly the push transistor 400 and the pull transistor 410 such that the corresponding "other transistor" is the pull transistor 410 in the case of the pull-up control circuit and the push transistor 400 in the case of the pull-down control circuit. However, in FIG. 6 another example is depicted, in which the plurality of transistors of the push-pull driver 210 comprises more than just the two previously-mentioned transistors.

In this context, it should be noted that push-pull drivers 210 are by far not required to use just one push stage 310 and one pull stage 330. Push-pull drivers 210 may also use a cascade of push stages 310 and/or pull stages 330, where each of the push stages 310 and/or of the pull stages 330 each comprise at least one push transistor 400 and/or a pull transistor 410, respectively. In these implementations, each of the push and/or pull stages may be coupled to the output of the push-pull driver by at least one separate coupling capacitor, which is not shared by the other stages. However, such an implementation will not be described here for the sake of simplicity only.

An active recovery current generation can be implemented, for instance, by using a transistor to bypass the pull-down resistive element 420 or the pull-up resistive element 450, respectively. In such an implementation, the push current generated by the push stage 310 may be fed to the output of the pull stage 330 while it is below an input voltage. Similarly, a pull current provided by the pull stage 330 may be fed to an output of the push stage 310, while it is positive, thus producing the recovery currents. For small signal levels, both outputs share the input current provided at the contact 290 for the supply potential in a conventional push-pull operation without doubling the input current.

In the case of a typical envelope tracking scenario, envelope tracking modulation signals with only rare big peaks may provide an application scenario, where such a push-pull driver 210 may be implemented. In such a case a large power-saving potential may exist of up to 50% due to lower input voltages compared to an implementation comprising a boost DC/DC converter.

In an implementation with separate DC shift driver stages 310, 330 for the output 220, an efficiency by using an active recovery current generation may even be improved. Tests have shown that, compared to a conventional approach, consuming approximately 7.9 mA, using a push-pull driver 210 may use only slightly more current of approximately 8.1 mA. However, it should be noted these results as well as the previously-described results merely describe examples, which merely serve to illustrate the operability of an implementation as described.

Moreover, it should be noted that although mainly implementations have been described without a boost DC/DC converter, the DC current provided to any of the inputs 390, 290 or 350 may equally well be modulated. Moreover, they may be delivered by a slow, efficient DC/DC converter which may cover the low frequency part of, for instance, the envelope tracking supply signal provided to the contact 290 for the supply potential. However, this merely represents an option when implementing a push-pull driver 210 according to an example. For the same of simplicity only, details are omitted here. The present description focuses on components having a higher bandwidth.

FIG. 5 shows a circuit diagram of an envelope tracking system 200 comprising a push-pull driver 210, which is modified compared to the one depicted in FIG. 3. To be a little more specific, the push-pull driver 210 comprises a first variant of the active recovery current generation briefly described before. However, the circuit of the push-pull driver 210 depicted in FIG. 5 resembles the circuit diagram of FIG. 3 to a large extent. As a consequence, reference is hereby made to the description of FIG. 3 for these components.

The push-pull driver 210 comprises a pull-up control circuit 600, which is coupled to the second coupling capacitor 340 and to the contact 290 for the supply potential to determine a voltage or a potential of the second coupling capacitor 340 with respect to the supply potential. An output of the pull-up control circuit 600 is coupled to a first switch 610, which in turn is coupled between the push transistor 400 and the first coupling capacitor 320. However, the first switch 610 is also coupled with another contact to the second coupling capacitor 340 in such a way that the push transistor 400 can be switched by the pull-up control circuit 600 to be coupled to the first coupling capacitor 320 or the second coupling capacitor 340 depending on the voltage determined by the pull-up control circuit 600. Similarly, the push-pull driver 210 further comprises a pull-down control circuit 620, which is coupled to a contact 630 for the reference potential and to the first coupling capacitor 320 to determine the potential or voltage of the first coupling capacitor 320 with respect to the reference potential. An output of the pull-down control circuit is coupled to a second switch 640, which is coupled between the pull transistor 410 and the second coupling capacitor 340. However, also the second switch 640 is coupled to the other of the two coupling capacitors 320, 340, namely the first coupling capacitor 320 in such a way that depending on the signal provided by the pull-down control circuit 620, the pull transistor 410 is coupled either to the first coupling capacitor 320 or to the second coupling capacitor 340.

In the example depicted in FIG. 5, the corresponding control inputs of the push and pull transistors 400, 410 are still connected to the control circuit 470 providing the respective control signals to the push transistor 400 and the pull transistor 410, respectively.

Due to these additional elements, the pull transistor 410 can be directly coupled to the first coupling capacitor 320 and therefore in parallel to the pull-down resistive element 420 to de-charge the first coupling capacitor 320. However, since this may require a certain energy or voltage to be present at the terminals of the pull transistor 410, the pull-down control circuit 620 determines the corresponding voltage at the first coupling capacitor 320 with respect to the reference potential present at the input 630 to determine as to whether operating the pull transistor 410 is possible. This may allow an easier and quicker discharging of the first coupling capacitor 320 such that a lower amount of energy is used. In other words, during this discharging of the first coupling capacitor 320, the second coupling capacitor 340 is not charged.

Similarly, the pull-up control circuit 600 verifies as to whether a voltage present at the push transistor 400 may allow the push transistor 400 to charge up the second coupling capacitor 340 bypassing the pull-up resistive element 450 by switching the first switch 610, when the voltage determined by the pull-up control circuit 600 allows bypassing the pull-up resistive element 450. In other words, in the example depicted in FIG. 5, the pull-up control circuit uses another transistor of the plurality of transistors comprising the push transistor 400 and the pull transistor 410 to electrically couple the contact 290 for the supply potential to the second coupling capacitor 340, when a first predetermined condition is fulfilled. Similarly, the pull-down control circuit 620 couples another transistor of the plurality of transistors other than the push transistor 400 to the first coupling capacitor 320 to electrically couple the first coupling capacitor 320 to the contact 300 for the reference potential, when a second predetermined condition is fulfilled. The first predetermined condition is fulfilled when the second coupling capacitor is to be charged up and the potential at the second coupling capacitor 340 allows operating the other transistor, namely the push transistor 400. Accordingly, the second predetermined condition is fulfilled when the first coupling capacitor 320 is to be discharged and the potential at the first coupling capacitor 320 allows operating the other transistor than the push transistor 400, namely the pull transistor 410, in the example depicted in FIG. 5.

Depending on the implementation, when one of the switches 610, 640 is switched, the other of the two switches 610, 640 may also be switched. This may allow actively coupling only a single transistor of the push transistor 400 and the pull transistor 410 to each of the coupling capacitors

320, 340. However, it should be noted that this may be an optional feature depending on the implementation of the control circuit 470. For instance, such a simultaneous switching of the switches 610, 640 may be omitable, when, for instance, the control signals provided to the transistors 400, 410 do not cause the two transistors to counteract each other's effect.

Depending on such an implementation, it may therefore be possible to couple the two control circuits 600, 620 and optionally also the control circuit 470 to prevent unwanted charging/discharging effects caused by two counteracting transistors.

In other words, the pull-up control circuit 600 may be capable and designed to pull up the second coupling capacitor 340 during operation by coupling the other transistor to the appropriate contact 290 for the supply potential. Similarly, the pull-down control circuit 620 may be designed and configured to pull down the potential of the first coupling capacitor 320 by coupling the corresponding other transistor to the contact 300 for the reference potential. The push transistor 400 and the pull transistor 410 may therefore be used to at least partially bypass the pull-up resistive element 450 and the pull-down resistive element 420, respectively.

Figure 6:
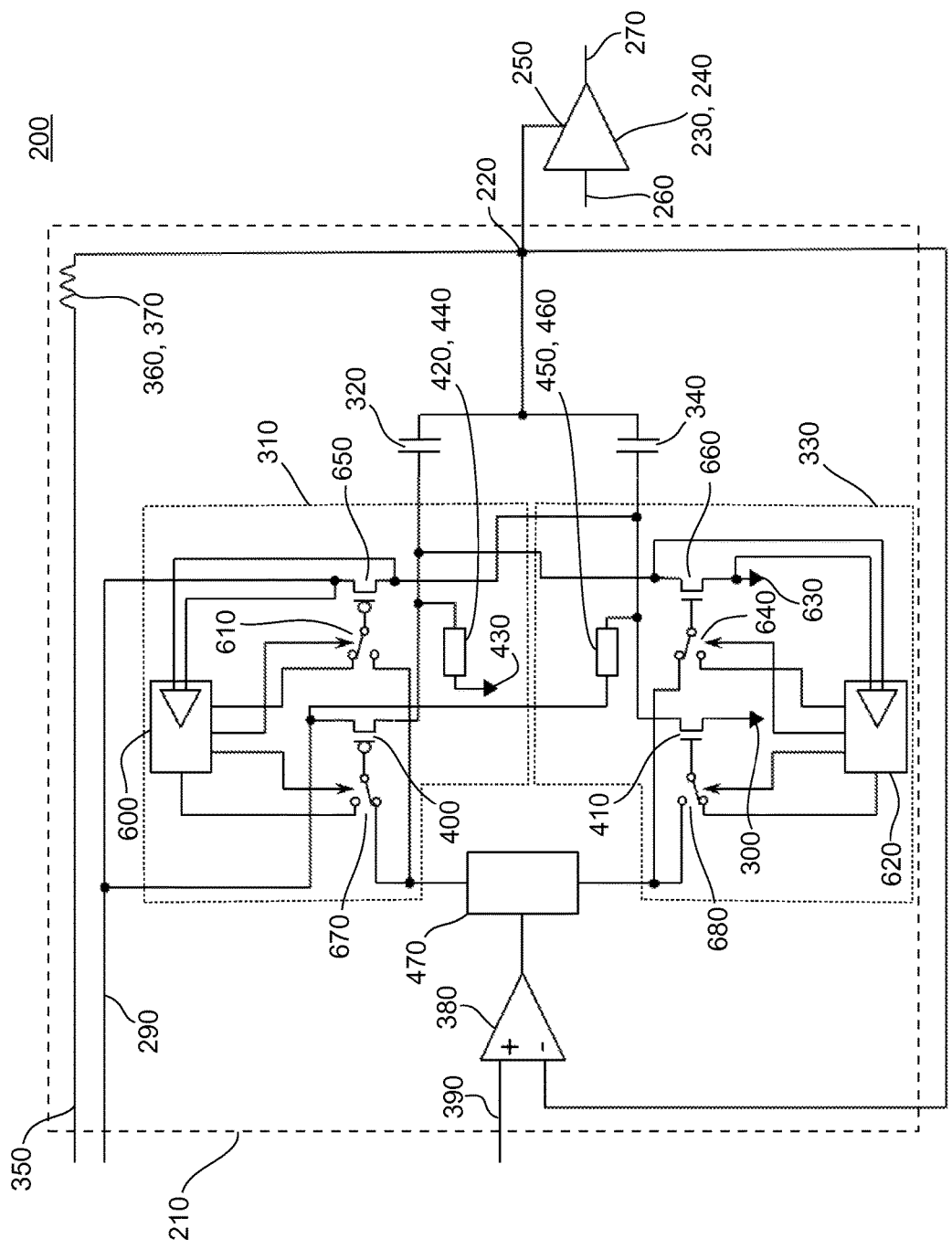
FIG. 6 shows a circuit diagram of a push-pull driver according to another example.

FIG. 6 shows another example of an envelope tracking system 200 comprising a push-pull driver 210 according to an example. The push-pull driver 210 of FIG. 6 also uses an active recovery current generation, which, however, is based on additional transistors and implementing not only a first switch and a second switch but two additional switches. Nevertheless, the general layout of the circuit of the push-pull driver 210 as depicted in FIG. 6 is comparably similar to the one depicted in FIG. 5. As a consequence, reference is hereby made to the previous description.

In terms of the similarities of the circuits of FIGS. 5 and 6 concerns the first and second switches 610, 640. They are no longer coupled in between the push transistor 400 and the first coupling capacitor 320 and the pull transistor 410 and the second coupling capacitor 340. However, once again, the switches 610, 640 are implemented as SPDT-like (single pole, double throw) switches allowing to electrically couple one out of two contacts with a third contact.

To go more into details, the push-pull driver 210 comprises a pull-up transistor 650 which is coupled between the contact 290 for the supply potential and the second coupling capacitor 340. The control terminal of the pull-up transistor 650 is coupled to the first switch 610 such that the control terminal of the pull-up transistor 650 can either be coupled to the pull-up control circuit 600 or to the control circuit 470. In the example depicted in FIG. 6, the pull-up control circuit 600 is configured to generate an off-signal for the pull-up transistor 650 comprising a control voltage such that the pull-up transistor 650 is turned off or insulating. The first switch 610 is further coupled to an output of the control circuit 470, which allows the pull-up transistor 650 to receive the control signal for the push transistor 400.

Similarly, the push-pull driver 210 comprises a pull-down transistor 660 coupled between the first coupling capacitor 320 and the contact 630 for the reference potential. A control terminal of the pull-down transistor 660 is symmetrical to the first switch 610 coupled to the second switch 640 such that either an off-signal generated by the pull-down control circuit 620 for the pull-down transistor 660 or the control signal generated by the control circuit 470 is switchable to the control input of the pull-down transistor 660.

The pull-up control circuit 600 as well as the pull-down control circuit 620 is once again coupled to the second coupling capacitor 340 and the contact 290 for the supply potential as well as to the first coupling capacitor 320 and the terminal 630 for the reference potential, respectively. As a consequence, the pull-up control circuit 600 an the pull-down control circuit 620 are once again capable of determining the respective voltages to verify as to whether the voltage drop may still allow the pull-up transistor 650 and the pull-down transistor 660 to operate, respectively, to charge the second coupling capacitor 340 and to discharge the first coupling capacitor 320, respectively.

However, the push-pull driver 210 further comprises a first further switch 670 and a second further switch 680, which are coupled to the control terminals of the push transistor 400 and the pull transistor 410, respectively. The two further switches 670, 680 are further coupled to the control circuit 470 and the respective control circuit 600, 620. To be a little more precise, the first further switch 670 is coupled to the control circuit 470 and to the pull-up control circuit 600 in such a way that due to the switching state of the first further switch 670 the control terminal of the push transistor 400 is either coupled to the control signal generated by the control circuit 470 for the push transistor 400 or to an off-signal for the push transistor 400, generated by the pull-up control circuit 600. Similarly, the second further switch 680 is coupled to the control circuit 470 and to the pull-down control circuit 620 to couple the control terminal of the pull transistor 410 to either the control signal for the pull transistor 410 generated by the control circuit 470 or to an off-signal for the pull transistor 410 generated by the pull-down control circuit 620.

The pull-up control circuit 600 and the pull-down control circuit 620 are coupled to the first switch 610 and the first further switch 670 as well as to the second switch 640 and the second further switch 680, respectively, to allow the appropriate switching. The off-signals for the push transistor 400 and the pull transistor 410 are designed in such a way that the push transistor 400 and the pull transistor 410 may be turned off or switched to an insulating state, when they are coupled to the respective off-signals.

Once again, the two control circuits 600, 620 are designed to control the previously-mentioned switches 610, 640, 670, 680 in such a way that during operation the corresponding transistors may be switched in parallel to the pull-down resistive element 420 and the pull-up resistive element 450 by switching the four switches appropriately. For instance, when the previously-mentioned first predetermined condition is fulfilled, the pull-up transistor 650 may be coupled to the second coupling capacitor 340 to pull the potential off this capacitor up. Similarly, when the second predetermined condition is fulfilled, the first coupling capacitor 320 may be coupled to the pull-down transistor 660 to bypass at least partially the pull-down resistive element 420 as long as the voltage present at the first coupling capacitor 320 allows operating the pull-down transistor 660. Here, the push transistor 400 may be switched off, for instance, when the pull-up transistor 650 is turned on. Similarly, the pull transistor 410 may be turned off when the pull-down transistor 660 is turned on. Similarly, when the push transistor 400 or the pull transistor 410 is turned on, the corresponding pull-up transistor 650 or pull-down transistor 660 may be turned off. Turning on the respective transistor may comprise in the example depicted in FIG. 6 coupling the respective transistor to its control signal generated by the control circuit 470. The control circuit 600, 620 may, for instance, be designed in such a way that, when the corresponding first or second predetermined condition is not fulfilled, the push transistor 400 or the pull transistor 410 is activated, while the corresponding pull-up transistor 650 and the pull-down transistor 660 is deactivated or turned off.

Figure 7:
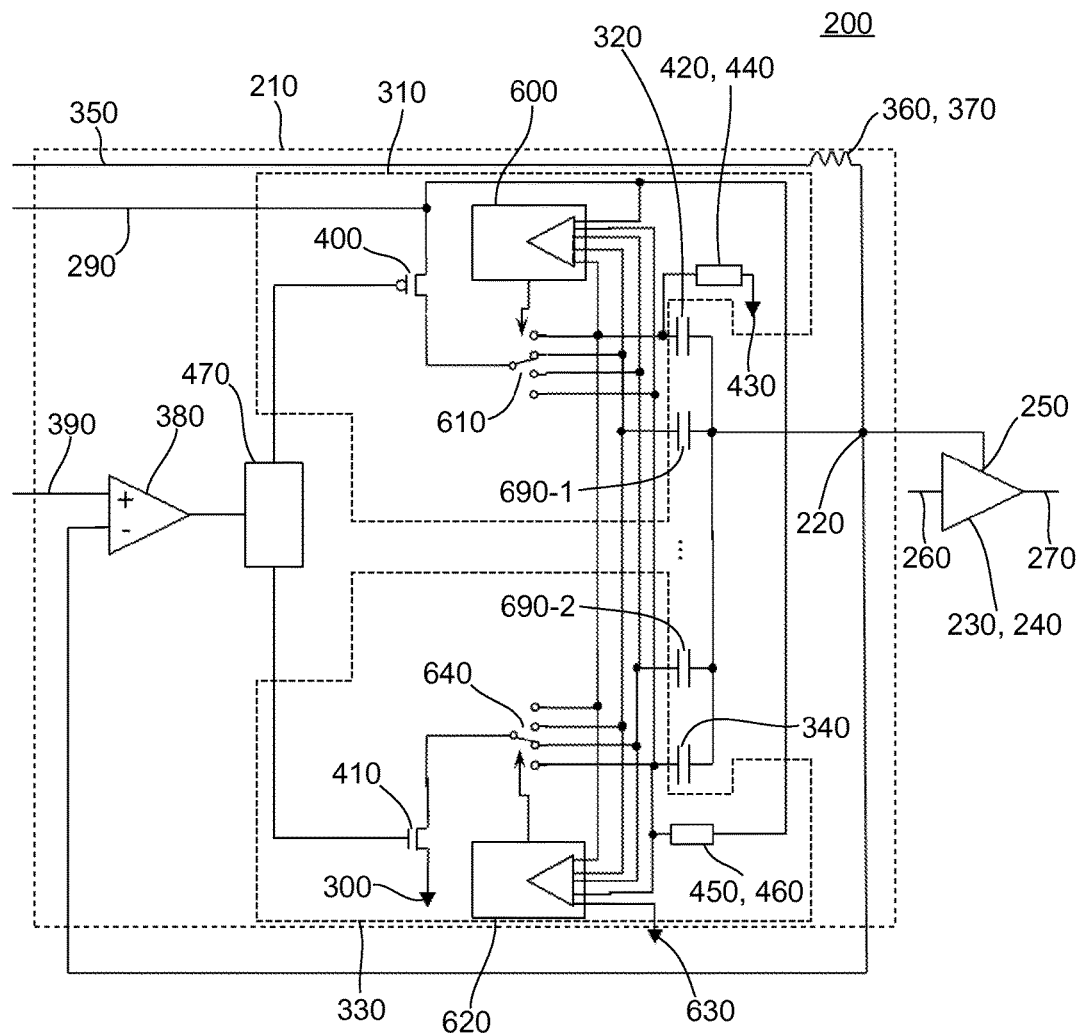
FIG. 7 shows a circuit diagram of a push-pull driver according to another example comprising more than two coupling capacitors.

FIG. 7 shows circuit diagram of a further example of an envelope tracking system 200 comprising a push-pull driver 210 according to an example. The push-pull driver 210 of FIG. 7 uses an active recovery current generation, which, however, is based on one or more further coupling capacitors 690. In the example depicted in FIG. 7, the push-pull driver 210 comprises a first further coupling capacitor 690-1 and a second further coupling capacitor 690-2, which are coupled to the output 220. By the first switch 610 and the second switch 620, the further coupling capacitors 690 may be conductively coupled to the push transistor 400 and the pull transistor 410, respectively. As described before, the switches 610, 620 may be controlled by the pull-up control circuit 600 and the pull-down control circuit 620, respectively. The pull-up control circuit 600 may conductively couple one of the further coupling capacitors 690 and the first coupling capacitor 320 and the second coupling capacitor 340 to the push transistor 400. The pull-down control circuit 620 may conductively couple one of the further coupling capacitors 690 and the second coupling capacitor 340 and the first coupling capacitor 320 to the pull transistor 410.

In order to control the first switch 610, the pull-up control circuit 600 may determine the potentials at the second coupling capacitor 340 and the further coupling capacitors 690 and the first coupling capacitor 320 with respect to the supply potential provided, for instance, at the contact 290. The first switch 610 may then be controlled based on the determined potentials to switch the push transistor 400 between the first coupling capacitor 320 and the further coupling capacitors 690 and the second coupling capacitor 340. Similarly, the pull-down control circuit 620 may determine the potentials at the first coupling capacitor 320 and the further coupling capacitors 690 and the second coupling capacitor 340 with respect to the reference potential, for instance, of the contact 630. The pull-down control circuit 620 may control the second switch 640 at least partially based on the determined potentials to switch the pull transistor 410 between the second coupling capacitor 340 and the further coupling capacitors 690 and the first coupling capacitor 320. However the switches don't necessarily have to switch all capacitors. In particular not all capacitors being connected to a pull-down resistive element 420 do necessarily have to be connected to the pull transistor 410, as sufficient charge may flow through the pull-down resistive element 420 anyhow. Similarly reasoning holds for the pull-up resistive element 450 and the push transistor 400. As described in FIG. 7, it may be sufficient to provide only one pull-down resistive element 420 respectively one pull-up resistive element 450, and they may be connected to the first coupling capacitor 320 and the second coupling capacitor 340. But some or all of the further coupling capacitors 690 may also be connected to such resistive elements, possibly with higher resistance.

The pull-up control circuit 600 and the pull-down control circuit 620 may, for instance, control the switches 610, 640 between the coupling capacitors 690 to establish a cascaded switching between the coupling capacitors 690, 320, 340. For instance, instead of conductively coupling the first or second coupling capacitor 320, 340 to the reference potential or the supply potential, respectively, the control circuits 600, 620 may couple one of the further coupling capacitors 690 to the respective transistors 400, 410 to reduce current from being drained to the reference potential or from being provided by the contact 290 for the supply potential. By cascading the respective first or second coupling capacitor 320, 340 and the coupling capacitors 690, it may be possible to reduce the current consumption even further. In an example, the pull-up control circuit 600 respectively the pull-down control circuit 620 may, for instance, control the switches 610, 640 to connect the capacitor which has the highest respectively lowest potential, which is still below respectively above the respective reference potential, possibly also adding a threshold value.

Figure 8:
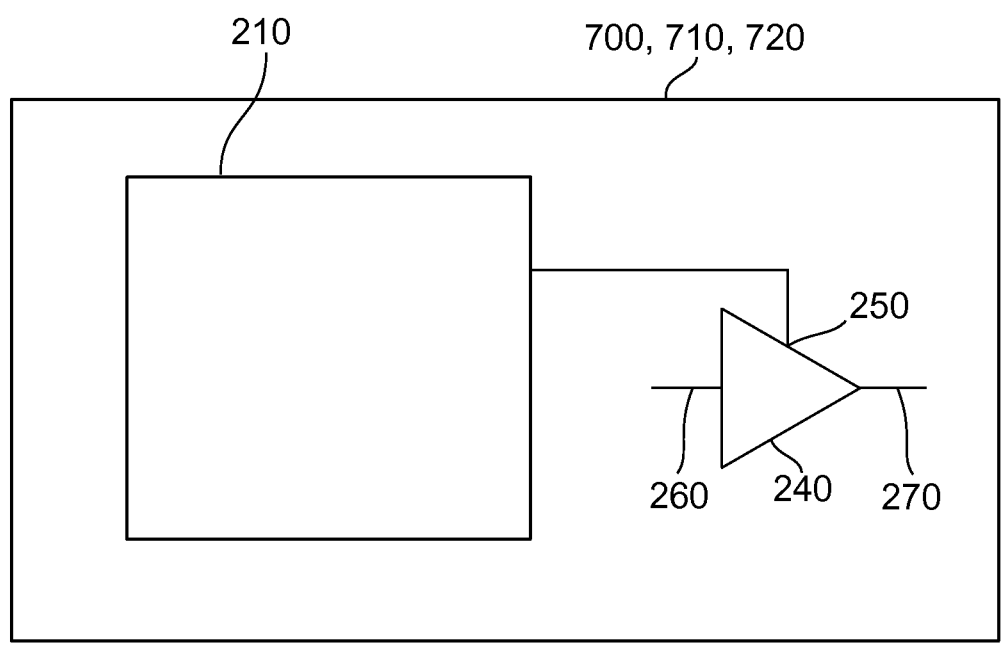
FIG. 8 shows a transmitter, a receiver or a transceiver according to an example comprising a push-pull driver according to an example.

FIG. 8 shows a schematic block diagram of a transmitter 700, a receiver 710 or a transceiver 720 comprising a push-pull driver 210 according to an example as, for instance, outlined before. The transmitter 700, the receiver 710 or the transceiver 720 may further comprise a power amplifier 240, which may, for instance, be coupled to a power supply contact 250 of the power amplifier 240. As outlined before, the push-pull driver 210 may provide the power amplifier 240 with a power supply signal provided at its output 220 (not shown in FIG. 8). For instance, the push-pull driver 210 as well as the power amplifier 240 may be part of the envelope tracking system 200 (not shown in FIG. 8). As described before, the power amplifier may further comprise an input 260 and an output 270 to obtain at the output 270 an output signal being an amplified version of the input signal provided to the input 260.

Figure 9:
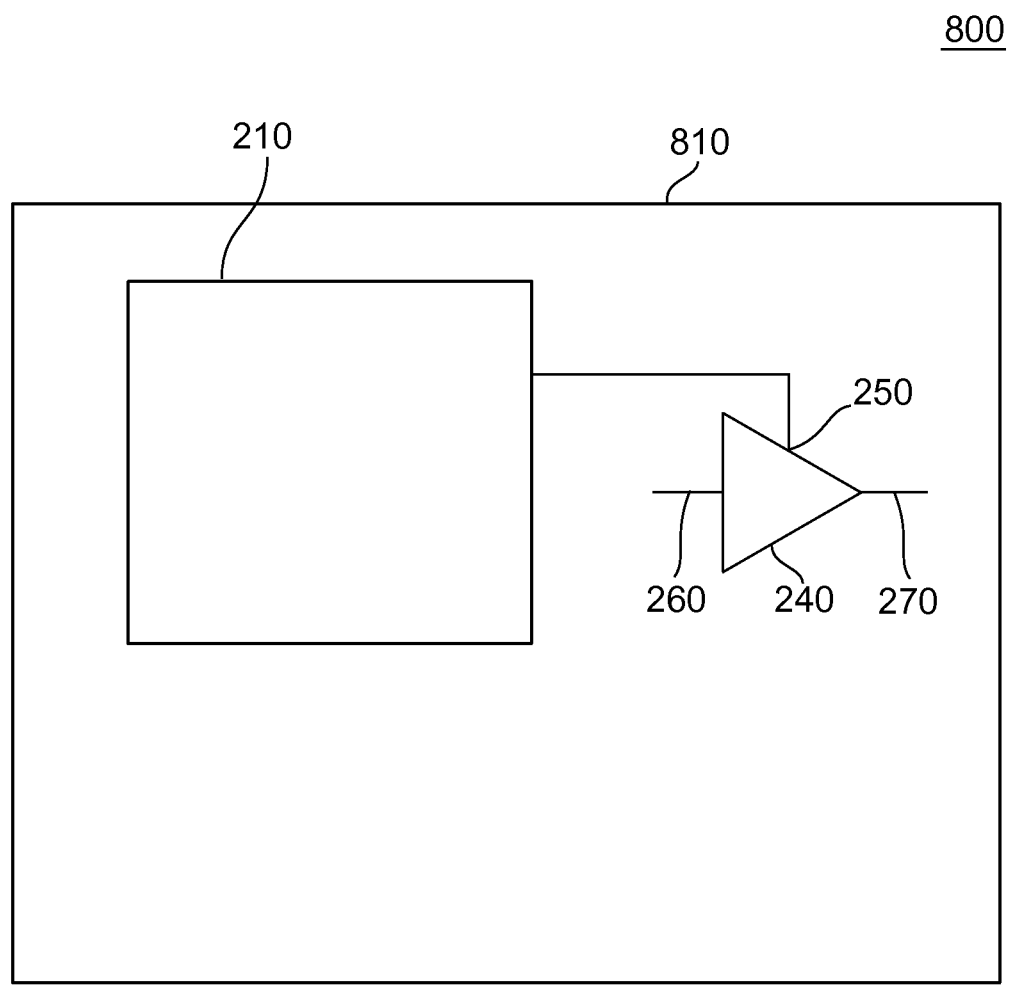
FIG. 9 shows a simplified block diagram of an integrated circuit according to an example comprising a push-pull driver according to an example.

FIG. 9 shows a schematic block diagram of an integrated circuit 800 comprising a push-pull driver 210 according to an example as, for instance, outlined before. The push-pull driver 210 may be integrated into a substrate 810. The substrate 810 may, for instance, be a semiconducting substrate or die having a main surface extending along two orthogonal directions. A thickness of the substrate 810 along a third direction orthogonal to both the first and second direction mentioned before, which are parallel to the main surface, may be substantially smaller than an extension of the substrate 810 along these two directions. For instance, depending on the implementation, the corresponding substrate 810 may have a thickness of less than 10%, less than 5% or even less than 1% of the smallest extension along the other two directions.

The substrate 810 may, for instance, be fabricated using semiconductor processes and/or thin-film process technology processes. These processes may include, for instance, patterning, milling, etching, depositing layers or growing layers, for instance, by epitactically growing material or amorphously growing or depositing layers. These processes may, for instance, be performed on a wafer made of a semiconducting or insulating material, before the wafer is diced to obtain the previously-described die-shaped substrate.

The substrate 810 may further comprise a power amplifier 240 also integrated into the substrate 810, wherein an output 200 (not shown in FIG. 9) of the push-pull driver 210 is coupled to a power supply input or contact of the power amplifier 240. As described before, the power amplifier may further comprise an input 260 and an output 270 to obtain at the output 270 an output signal being an amplified version of the input signal provided to the input 260.

Figure 10:
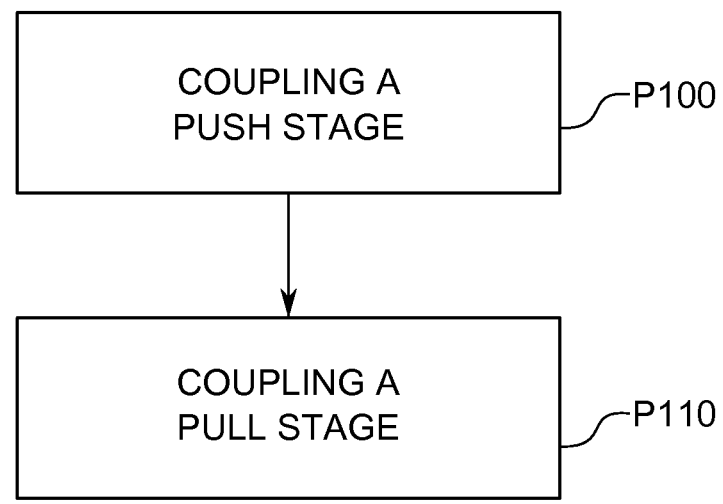
FIG. 10 shows a flowchart of a method according to an example for generating a signal at an output.

FIG. 10 shows a flowchart of a method for generating a signal at an output 220 (not shown in FIG. 10). The method comprises in a process P100, coupling a push stage 310 of a push-pull driver 210 via a first coupling capacitor 320 to an output 220 of the push-pull driver 210. In a process P110 the method comprises coupling a pull stage 320 of the push-pull driver 210 via a second coupling capacitor 340 to the output of the push-pull driver 210.

The method may further comprise additional processes which may be outlined in more detail below. Any of these processes may be performed in any order unless explicitly or implicitly stated otherwise. Moreover, the processes may also be performed at least partially timely overlapping or even synchronously.

Examples may be used, for example, in high volume architectures such as computer system architectures in a wide sense including mobile devices such as mobile phones, mobile computing devices and other mobile devices. They may also be used in high volume interfaces employing corresponding devices and associated manufacturing processes including, for instance, thin film manufacturing processes and/or semiconductor manufacturing processes.

In the following examples pertain to further examples.

Example 1 is a push-pull driver comprising a push stage coupled via a first coupling capacitor to an output of the push-pull driver, and a pull stage coupled via a second coupling capacitor to the output of the push-pull driver.

In example 2, the subject matter of example 1 may optionally include the push stage being coupled between a contact for a supply potential and the first coupling capacitor, and wherein the pull stage is coupled between a contact for a reference potential and the second coupling capacitor.

In example 3, the subject matter of example 2 may optionally include the push stage comprising a pull-down resistive element coupled between the first coupling capacitor and a contact for the reference potential, and wherein the pull stage comprises a pull-up resistive element coupled between the second coupling capacitor and a contact for the supply potential.

In example 4, the subject matter of example 3 may optionally include the pull-down resistive element and the pull-up resistive element comprising at least one of a resistor, a transistor and a diode.

In example 5, the subject matter of any of the examples 1 to 4 may optionally include the push stage comprising a push transistor coupled between a contact for a supply potential and the first coupling capacitor, and wherein the pull stage comprises a pull transistor coupled between a contact for a reference potential and the second coupling capacitor.

In example 6, the subject matter of example 5 may optionally include the push transistor and the pull transistor being complementary transistors.

In example 7, the subject matter of any of the examples 5 or 6 may optionally include the push transistor is a PMOS transistor, and wherein the pull transistor is a NMOS transistor.

In example 8, the subject matter of any of the examples 5 to 7 may optionally include the first coupling capacitor being, apart from a coupling via the output, at least temporarily electrically decoupled from the pull transistor, and wherein the second coupling capacitor is, apart from a coupling via the output, at least temporarily electrically decoupled from the push transistor. Further optionally, at least temporarily decoupling may comprise only temporarily decoupling or permanently decoupling the respective components from one another.

In example 9, the subject matter of example 8 may optionally include the first coupling capacitor being, apart from the coupling via the output, permanently electrically decoupled from the pull transistor during operation, and wherein the second coupling capacitor is, apart from the coupling via the output, permanently electrically decoupled from the push transistor during operation.

In example 10, the subject matter of any of the examples 5 to 9 may optionally include the push-pull driver comprising a plurality of transistors comprising the push transistor and the pull transistor, wherein the push-pull driver comprises a pull-up control circuit, wherein the pull-up control circuit is configured to determine a potential at the second coupling capacitor with respect to the supply potential, wherein the pull-up control circuit is configured to couple another transistor of the plurality of transistors other than the pull transistor to the second coupling capacitor to electrically couple the contact for the supply potential to the second coupling capacitor only temporarily, when a first predetermined condition is fulfilled, and wherein the push-pull driver comprises a pull-down control circuit, wherein the pull-down control circuit is configured to determine a potential at the first coupling capacitor with respect to the reference potential, wherein the pull-down control circuit is configured to couple another transistor of the plurality of transistors other than the push transistor to the first coupling capacitor to electrically couple the contact for the reference potential to the first coupling capacitor only temporarily, when a second predetermined condition is fulfilled.

In example 11, the subject matter of example 10 may optionally include the first predetermined condition being fulfilled, when the second coupling capacitor is to be charged up and the potential at the second coupling capacitor allows operating the other transistor than the pull transistor, and wherein the second predetermined condition is fulfilled, when the first coupling capacitor is to be discharged and the potential at the first coupling capacitor allows operating the other transistor than the push transistor.

In example 12, the subject matter of any of the examples 10 or 11 may optionally comprise a first switch coupled to the other transistor of the plurality of transistors other than the pull transistor, wherein the pull-up control circuit is coupled to the first switch and configured to couple and to decouple the contact for the supply potential to or from the second coupling capacitor, respectively, and wherein the push-pull driver comprises a second switch coupled to the other transistor of the plurality of transistors other than the push transistor, wherein the pull-down control circuit is coupled to the second switch and configured to couple and to decouple the contact for the reference potential to or from the first coupling capacitor, respectively.

In example 13, the subject matter of any of the examples 5 to 12 may optionally comprise a first switch electrically coupled between the push transistor and the first coupling capacitor, wherein the first switch is further electrically coupled to the second coupling capacitor and configured to electrically couple either the first coupling capacitor or the second coupling capacitor to the push transistor.

In example 14, the subject matter of example 13 may optionally comprise a pull-up control circuit configured to determine a potential at the second coupling capacitor with respect to the supply potential and to control the first switch at least based on the determined potential at the second coupling capacitor.

In example 15, the subject matter of example 14 may optionally include the pull-up control circuit being configured to couple the push transistor to the second coupling capacitor to electrically couple the contact for the supply potential to the second coupling capacitor only temporarily, when a first predetermined condition is fulfilled.

In example 16, the subject matter of example 15 may optionally include the first predetermined condition being fulfilled, when the second coupling capacitor is to be charged up and the potential at the second coupling capacitor allows operating the push transistor.

In example 17, the subject matter of any of the examples 13 to 16 may optionally comprise a second switch electrically coupled between the pull transistor and the second coupling capacitor, wherein the second switch is further electrically coupled to the first coupling capacitor and configured to electrically couple either the first coupling capacitor or the second capacitor to the pull transistor.

In example 18, the subject matter of example 17 may optionally further comprise a pull-down control circuit configured to determine a potential at the first coupling capacitor with respect to the reference potential and to control the second switch at least based on the determined potential at the first coupling capacitor.

In example 19, the subject matter of example 18 may optionally include the pull-down control circuit being configured to couple the pull transistor to the first coupling capacitor to electrically couple the contact for the reference potential to the first coupling capacitor only temporarily, when a second predetermined condition is fulfilled.

In example 20, the subject matter of example 19 may optionally include the second predetermined condition being fulfilled, when the first coupling capacitor is to be discharged and the potential at the first coupling capacitor allows operating the pull transistor.

In example 21, the subject matter of any of the examples 5 to 12 may optionally comprise a pull-up transistor electrically coupled between the contact for the supply potential and the second coupling capacitor, wherein the push-pull driver comprises a first switch coupled to a control input of the pull-up transistor and configured to switch the control input of the pull-up transistor between a contact for a control signal for the push transistor and a contact for an off-signal for the pull-up transistor, wherein the push-pull driver comprises a pull-up control circuit configured to determine a potential at the second coupling capacitor with respect to the supply potential, wherein the pull-up control circuit is configured to control the first switch at least based on the determined potential at the second coupling capacitor and to generate the off-signal for the pull-up transistor, wherein the push-pull driver further comprises a first further switch coupled to a control input of the push transistor and configured to switch the control input of the push transistor between the contact for the control signal for the push transistor and a contact for an off-signal for the push transistor, and wherein the pull-up control circuit is configured to control the first further switch at least based on the determined potential at the second coupling capacitor and to generate the off-signal for the push transistor.

In example 22, the subject matter of example 21 may optionally include the pull-up control circuit being configured to couple the pull-up transistor to the input for the control signal of the push transistor and to couple the push transistor to the off-signal for the push transistor to electrically couple the contact for the supply potential to the second coupling capacitor, when a first predetermined condition is fulfilled.

In example 23, the subject matter of example 22 may optionally include the pull-up control circuit being configured to couple the push transistor to the input for the control signal of the push transistor and to couple the pull-up transistor to the off-signal for the pull-up transistor to electrically decouple the contact for the supply potential from the second coupling capacitor, when the first predetermined condition is not fulfilled.

In example 24, the subject matter of any of the examples 22 or 23 may optionally include the first predetermined condition being fulfilled, when the second coupling capacitor is to be charged up and the potential at the second coupling capacitor allows operating the pull-up transistor.

In example 25, the subject matter of any of the examples 21 to 24 may optionally comprise a pull-down transistor electrically coupled between the contact for the reference potential and the first coupling capacitor, wherein the push-pull driver comprises a second switch coupled to a control input of the pull-down transistor and configured to switch the control input of the pull-down transistor between a contact for a control signal for the pull transistor and a contact for an off-signal for the pull-down transistor, wherein the push-pull driver comprises a pull-down control circuit configured to determine a potential at the first coupling capacitor with respect to the reference potential, wherein the pull-down control circuit is configured to control the second switch at least based on the determined potential at the first coupling capacitor and to generate the off-signal for the pull-down transistor, wherein the push-pull driver further comprises second further switch coupled to a control input of the pull transistor and configured to switch the control input of the pull transistor between the contact for the control signal for the pull transistor and a contact for an off-signal for the pull transistor, and wherein the pull-down control circuit is configured to control the second further switch at least based on the determined potential at the first coupling capacitor and to generate the off-signal for the pull transistor.

In example 26, the subject matter of example 25 may optionally include the pull-down control circuit being configured to couple the pull-down transistor to the input for the control signal of the pull transistor and to couple the pull transistor to the off-signal for the pull transistor to electrically couple the contact for the reference potential to the first coupling capacitor, when a second predetermined condition is fulfilled.

In example 27, the subject matter of example 26 may optionally include the pull-down control circuit being configured to couple the pull transistor to the input for the control signal of the pull transistor and to couple the pull-down transistor to the off-signal for the pull-down transistor to electrically decouple the contact for the reference potential from the first coupling capacitor, when the second predetermined condition is not fulfilled.

In example 28, the subject matter of any of the examples 26 or 27 may optionally include the second predetermined condition being fulfilled, when the first coupling capacitor is to be charged up and the potential at the first coupling capacitor allows operating the pull-down transistor.

In example 29, the subject matter of any of the examples 5 to 28 may optionally comprise a control circuit coupled to the push transistor and the pull transistor, wherein the control circuit is configured to generate a control signal for the push transistor and a control signal for the pull transistor and to provide the control signal for the push transistor to the push transistor and the control signal for the pull transistor to the pull transistor.

In example 30, the subject matter of example 29 may optionally comprise an operational amplifier coupled to the output of the push-pull driver and configured to generate a difference signal based on a signal from the output and a target signal.

In example 31, the subject matter of any of the examples 5 to 30 may optionally comprise a plurality of coupling capacitors, the plurality of capacitors comprising at least the first coupling capacitor, the second coupling capacitor and at least one further coupling capacitor, wherein the at least one further coupling capacitor is coupled to the output of the push-pull driver, wherein the push stage comprises a first switch coupled between the push transistor and the first coupling capacitor and between the push transistor and the at least one further coupling capacitor, wherein the pull stage comprises a second switch coupled between the pull transistor and the second coupling capacitor and between the pull transistor and the at least one further coupling capacitor, wherein the first switch is configured to connect the push transistor to one of the first coupling capacitor and the at least one the further coupling capacitor, and wherein the second switch is configured to connect the pull transistor to one of the second coupling capacitor and the at least one the further coupling capacitor.

In example 32, the subject matter of example 31 may optionally further include a pull-up control circuit being configured to determine the potentials at the second coupling capacitor and the at least one further coupling capacitor with respect to the supply potential, wherein the pull-up control circuit is configured to control the first switch at least based on the determined potentials to switch the push transistor between the first coupling capacitor and the further coupling capacitors, and wherein the push-pull driver further comprises a pull-down control circuit configured to determine the potentials at the first coupling capacitor and the at least one further coupling capacitor with respect to the reference potential, wherein the pull-down control circuit is configured to control the second switch at least based on the determined potentials to switch the pull transistor between the second coupling capacitor and the further coupling capacitors.

In example 33, the subject matter of example 32 may optionally include the pull-up control circuit and the pull-down control circuit being configured to switch between the coupling capacitors to establish a cascaded switching between the coupling capacitors.

In example 34, the subject matter of any of the examples 31 to 33 may optionally include the at least one further coupling capacitor comprising a plurality of coupling capacitors. Optionally, all the coupling capacitors may be coupled to the push transistor and the pull transistor by the first switch and the pull switch, respectively.

In example 35, the subject matter of any of the examples 5 to 34 may optionally comprise a control circuit coupled to the push stage and the pull stage, wherein the control circuit is configured to generate a control signal for the push stage and a control signal for the pull stage and to provide the control signal for the push stage to the push stage and the control signal for the pull stage to the pull stage.

In example 36, the subject matter of any of the examples 1 to 35 may optionally comprise an input for an additional input signal and a decoupling element coupled between the input for the additional input signal and the output of the push-pull driver.

In example 37, the subject matter of example 36 may optionally include the decoupling element comprising at least one of a low pass filter, an inductive element and a inductor.

In example 38, the subject matter of any of the examples 1 to 37 may optionally include the first coupling capacitor and second coupling capacitor being permanently coupled to the output during operation.

In example 39, the subject matter of any of the examples 1 to 38 may optionally include the output being formed by a common contact coupled to the first coupling capacitor and to the second coupling capacitor.

Example 40 is a transmitter, a receiver or a transceiver comprising a push-pull driver according to any of the examples 1 to 39.

In example 41, the subject matter of example 40 may optionally further comprise a power amplifier coupled to the output of the push-pull driver.

Example 42 is an integrated circuit comprising a substrate, into which a push-pull driver according to any of the examples 1 to 41 is integrated.

In example 43, the subject matter of example 42 may optionally further comprise a power amplifier integrated into the substrate and coupled to the output of the push-pull driver.

Example 44 is a method for generating a signal at an output, the method comprises coupling a push stage of a push-pull driver via a first coupling capacitor to an output of the push-pull driver, and coupling a pull stage of the push-pull driver via a second coupling capacitor to the output of the push-pull driver.

In example 45, the subject matter of example 44 may optionally include coupling the push stage comprising coupling the push stage between a contact for a supply potential and the first coupling capacitor, and wherein coupling the pull stage comprises coupling the pull stage between a contact for a reference potential and the second coupling capacitor.

In example 46, the subject matter of any of the examples 44 or 45 may optionally further comprise resistively coupling the first coupling capacitor to a supply potential, and resistively coupling the second coupling capacitor to a reference potential.

In example 47, the subject matter of example 46 may optionally include resistively coupling the first coupling capacitor and resistively coupling the second coupling capacitor comprising resistively coupling the respective coupling capacitor by at least one of a resistor, a transistor and a diode.

In example 48, the subject matter of any of the examples 44 to 47 may optionally include coupling the push stage comprising coupling the push stage via a push transistor coupled between a contact for a supply potential and the first coupling capacitor, and wherein coupling the push stage comprises coupling the pull stage via a pull transistor coupled between a contact for a reference potential and the second coupling capacitor.

In example 49, the subject matter of example 48 may optionally include the push transistor and the pull transistor being complementary transistors.

In example 50, the subject matter of any of the examples 48 or 49 may optionally include the push transistor being a PMOS transistor, and wherein the pull transistor is a NMOS transistor.

In example 51, the subject matter of any of the examples 48 to 50 may optionally include the first coupling capacitor being apart from a coupling via the output, at least temporarily electrically decoupled from the pull transistor, and wherein the second coupling capacitor is, apart from a coupling via the output, at least temporarily electrically decoupled from the push transistor.

In example 52, the subject matter of example 51 may optionally include the first coupling capacitor being, apart from a coupling via the output, permanently electrically decoupled from the pull transistor during operation, and wherein the second coupling capacitor is, apart from a coupling via the output, permanently electrically decoupled from the push transistor during operation.

In example 53, the subject matter of any of the examples 48 to 52 may optionally include the push-pull driver comprising a plurality of transistors comprising the push transistor and the pull transistor, wherein the method comprises determining a potential at the second coupling capacitor with respect to the supply potential and coupling another transistor of the plurality of transistors other than the pull transistor to the second coupling capacitor to electrically couple the contact for the supply potential to the second coupling capacitor only temporarily, when a first predetermined condition is fulfilled, and wherein the method comprises determining a potential at the first coupling capacitor with respect to the reference potential and coupling another transistor of the plurality of transistors other than the push transistor to the first coupling capacitor to electrically couple the contact for the reference potential to the first coupling capacitor only temporarily, when a second predetermined condition is fulfilled.

In example 54, the subject matter of example 53 may optionally include the first predetermined condition being fulfilled, when the second coupling capacitor is to be charged up and the potential at the second coupling capacitor allows operating the other transistor than the pull transistor, and wherein the second predetermined condition is fulfilled, when the first coupling capacitor is to be discharged and the potential at the first coupling capacitor allows operating the other transistor than the push transistor.

In example 55, the subject matter of any of the examples 48 to 54 may optionally comprise generating a control signal for the push transistor and a control signal for the pull transistor and providing the control signal for the push transistor to the push transistor and the control signal for the pull transistor to the pull transistor.

In example 56, the subject matter of example 55 may optionally further comprise generating a difference signal based on a signal from the output and a target signal by comparing the signal from the output and the target signal.

In example 57, the subject matter of any of the examples 44 to 56 may optionally comprise generating a control signal for the push stage and a control signal for the pull stage and providing the control signal for the push stage to the push stage and the control signal for the pull stage to the pull stage.

In example 58, the subject matter of any of the examples 44 to 57 may optionally comprise coupling an input for an input signal to the output of the push-pull driver via a decoupling element.

In example 59, the subject matter of example 58 may optionally include the decoupling element comprising at least one of a low pass filter, an inductive element and a inductor.

In example 60, the subject matter of any of the examples 44 to 59 may optionally include the first coupling capacitor and second coupling capacitor being permanently coupled to the output during operation.

In example 61, the subject matter of any of the examples 44 to 60 may optionally include the output being formed by a common contact coupled to the first coupling capacitor and to the second coupling capacitor.

Example 62 is a machine readable storage medium including program code, when executed, to cause a machine to perform the method of any one of examples 44 to 61.

Example 63 is a machine readable storage including machine readable instructions, when executed, to implement a method or realize an apparatus as described in any pending example.

Example 64 is a computer program having a program code for performing any of the methods of examples 44 to 61, when the computer program is executed on a computer or processor.

Example 65 is a means for generating a signal at an output, the means comprises a means for coupling a push stage of a push-pull driver via a first coupling capacitor to an output of the push-pull driver, and a means for coupling a pull stage of the push-pull driver via a second coupling capacitor to the output of the push-pull driver.

Using an example may allow to improve a trade-off between saving energy, an overall complexity of a corresponding implementation, a robust and reliable operation and other parameters and design goals.

Examples may, therefore, provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple processes, acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub-acts or sub-processes may be included and be part of such a single act or process, unless explicitly excluded.

The invention claimed is:

1. A push-pull driver comprising:
a push stage coupled via a first coupling capacitor to an output of the push-pull driver, wherein the push stage is coupled between a contact for a supply potential and the first coupling capacitor, and wherein the push stage comprises a pull-down resistive element coupled between the first coupling capacitor and a first contact for a reference potential; and
a pull stage coupled via a second coupling capacitor to the output of the push-pull driver, wherein the pull stage is coupled between a second contact for the reference potential and the second coupling capacitor, and wherein the pull stage comprises a pull-up resistive element coupled between the second coupling capacitor and the contact for the supply potential.

2. The push-pull driver according to claim 1, wherein the pull-down resistive element and the pull-up resistive element comprises at least one of a resistor, a transistor and a diode.

3. A push-pull driver comprising:
a push stage coupled via a first coupling capacitor to an output of the push-pull driver, wherein the push stage comprises a push transistor coupled between a contact for a supply potential and the first coupling capacitor; and
a pull stage coupled via a second coupling capacitor to the output of the push-pull driver, wherein the pull stage comprises a pull transistor coupled between a contact for a reference potential and the second coupling capacitor,
wherein the first coupling capacitor is, apart from a coupling via the output, at least temporarily electrically decoupled from the pull transistor, and wherein the second coupling capacitor is, apart from a coupling via the output, at least temporarily electrically decoupled from the push transistor.

4. The push-pull driver according to claim 3, wherein the push transistor and the pull transistor are complementary transistors.

5. The push-pull driver according to claim 3, wherein the push transistor is a PMOS transistor, and wherein the pull transistor is a NMOS transistor.

6. The push-pull driver according to claim 3, wherein the first coupling capacitor is, apart from the coupling via the output, permanently electrically decoupled from the pull transistor during operation, and wherein the second coupling capacitor is, apart from the coupling via the output, permanently electrically decoupled from the push transistor during operation.

7. The push-pull driver according to claim 3, wherein the push-pull driver comprises a plurality of transistors comprising the push transistor and the pull transistor, wherein the push-pull driver comprises a pull-up control circuit, wherein the pull-up control circuit is configured to determine a potential at the second coupling capacitor with respect to the supply potential, wherein the pull-up control circuit is configured to couple another transistor of the plurality of transistors other than the pull transistor to the second coupling capacitor to electrically couple the contact for the supply potential to the second coupling capacitor only temporarily, when a first predetermined condition is fulfilled, and wherein the push-pull driver comprises a pull-down control circuit, wherein the pull-down control circuit is configured to determine a potential at the first coupling capacitor with respect to the reference potential, wherein the pull-down control circuit is configured to couple another transistor of the plurality of transistors other than the push transistor to the first coupling capacitor to electrically couple the contact for the reference potential to the first coupling capacitor only temporarily, when a second predetermined condition is fulfilled.

8. The push-pull driver according to claim 7, wherein the first predetermined condition is fulfilled, when the second coupling capacitor is to be charged up and the potential at the second coupling capacitor allows operating the other transistor than the pull transistor, and wherein the second predetermined condition is fulfilled, when the first coupling capacitor is to be discharged and the potential at the first coupling capacitor allows operating the other transistor than the push transistor.

9. The push-pull driver according to claim 7, comprising a first switch coupled to the other transistor of the plurality of transistors other than the pull transistor, wherein the pull-up control circuit is coupled to the first switch and configured to couple and to decouple the contact for the supply potential to or from the second coupling capacitor, respectively, and wherein the push-pull driver comprises a second switch coupled to the other transistor of the plurality of transistors other than the push transistor, wherein the pull-down control circuit is coupled to the second switch and configured to couple and to decouple the contact for the reference potential to or from the first coupling capacitor, respectively.

10. The push-pull driver according to claim 3, comprising a first switch electrically coupled between the push transistor and the first coupling capacitor, wherein the first switch is further electrically coupled to the second coupling capacitor and configured to electrically couple either the first coupling capacitor or the second coupling capacitor to the push transistor.

11. The push-pull driver according to claim 10, further comprising a pull-up control circuit configured to determine a potential at the second coupling capacitor with respect to the supply potential and to control the first switch at least based on the determined potential at the second coupling capacitor.

12. The push-pull driver according to claim 11, wherein the pull-up control circuit is configured to couple the push transistor to the second coupling capacitor to electrically couple the contact for the supply potential to the second coupling capacitor only temporarily, when a first predetermined condition is fulfilled.

13. The push-pull driver according to claim 12, wherein the first predetermined condition is fulfilled, when the second coupling capacitor is to be charged up and the potential at the second coupling capacitor allows operating the push transistor.

14. The push-pull driver according to claim 10, comprising a second switch electrically coupled between the pull transistor and the second coupling capacitor, wherein the second switch is further electrically coupled to the first coupling capacitor and configured to electrically couple either the first coupling capacitor or the second capacitor to the pull transistor.

15. The push-pull driver according to claim 14, further comprising a pull-down control circuit configured to determine a potential at the first coupling capacitor with respect to the reference potential and to control the second switch at least based on the determined potential at the first coupling capacitor.

16. The push-pull driver according to claim 15, wherein the pull-down control circuit is configured to couple the pull transistor to the first coupling capacitor to electrically couple the contact for the reference potential to the first coupling capacitor only temporarily, when a second predetermined condition is fulfilled.

17. The push-pull driver according to claim 16, wherein the second predetermined condition is fulfilled, when the first coupling capacitor is to be discharged and the potential at the first coupling capacitor allows operating the pull transistor.

18. The push-pull driver according to claim 3, comprising a pull-up transistor electrically coupled between the contact for the supply potential and the second coupling capacitor, wherein the push-pull driver comprises a first switch coupled to a control input of the pull-up transistor and configured to switch the control input of the pull-up transistor between a contact for a control signal for the push transistor and a contact for an off-signal for the pull-up transistor, wherein the push-pull driver comprises a pull-up control circuit configured to determine a potential at the second coupling capacitor with respect to the supply potential, wherein the pull-up control circuit is configured to control the first switch at least based on the determined potential at the second coupling capacitor and to generate the off-signal for the pull-up transistor, wherein the push-pull driver further comprises a first further switch coupled to a control input of the push transistor and configured to switch the control input of the push transistor between the contact for the control signal for the push transistor and a contact for an off-signal for the push transistor, and wherein the pull-up control circuit is configured to control the first further switch at least based on the determined potential at the second coupling capacitor and to generate the off-signal for the push transistor.

19. The push-pull driver according to claim 18, wherein the pull-up control circuit is configured to couple the pull-up transistor to the input for the control signal of the push transistor and to couple the push transistor to the off-signal for the push transistor to electrically couple the contact for the supply potential to the second coupling capacitor, when a first predetermined condition is fulfilled.

20. A transmitter, a receiver or a transceiver comprising a push-pull driver, the push-pull driver comprising:
    a push stage coupled via a first coupling capacitor to an output of the push-pull driver, wherein the push stage is coupled between a contact for a supply potential and the first coupling capacitor, and wherein the push stage comprises a pull-down resistive element coupled between the first coupling capacitor and a first contact for a reference potential; and
    a pull stage coupled via a second coupling capacitor to the output of the push-pull driver, wherein the pull stage is coupled between a second contact for the reference potential and the second coupling capacitor, and wherein the pull stage comprises a pull-up resistive element coupled between the second coupling capacitor and the contact for the supply potential.

21. An integrated circuit comprising a substrate, into which a push-pull driver is integrated, the push-pull driver comprising:
    a push stage coupled via a first coupling capacitor to an output of the push-pull driver, wherein the push stage is coupled between a contact for a supply potential and the first coupling capacitor, and wherein the push stage comprises a pull-down resistive element coupled between the first coupling capacitor and a first contact for a reference potential; and
    a pull stage coupled via a second coupling capacitor to the output of the push-pull driver, wherein the pull stage is coupled between a second contact for the reference potential and the second coupling capacitor, and wherein the pull stage comprises a pull-up resistive element coupled between the second coupling capacitor and the contact for the supply potential.

22. A method for generating a signal at an output, the method comprising:
    coupling a push stage of a push-pull driver via a first coupling capacitor to an output of the push-pull driver by coupling the push stage between a contact for a supply potential and the first coupling capacitor;
    coupling a pull-down resistive element between the first coupling capacitor and a first contact for a reference potential;

coupling a pull stage of the push-pull driver via a second coupling capacitor to the output of the push-pull driver by coupling the pull stage between a second contact for the reference potential and the second coupling capacitor; and coupling a pull-up resistive element between the second coupling capacitor and the contact for the supply potential.

23. A method for generating a signal at an output, the method comprising:

coupling a push stage of a push-pull driver via a first coupling capacitor to an output of the push-pull driver, wherein the push stage comprises a push transistor coupled between a contact for a supply potential and the first coupling capacitor; and coupling a pull stage of the push-pull driver via a second coupling capacitor to the output of the push-pull driver, wherein the pull stage comprises a pull transistor coupled between a contact for a reference potential and the second coupling capacitor, wherein the first coupling capacitor is, apart from a coupling via the output, at least temporarily electrically decoupled from the pull transistor, and wherein the second coupling capacitor is, apart from a coupling via the output, at least temporarily electrically decoupled from the push transistor.

* * * * *